(12) United States Patent
Godet et al.

(10) Patent No.: US 11,764,099 B2
(45) Date of Patent: Sep. 19, 2023

(54) PATTERNED CHUCK FOR DOUBLE-SIDED PROCESSING

(71) Applicant: Applied Materials, Inc., Santa Clara, CA (US)

(72) Inventors: Ludovic Godet, Sunnyvale, CA (US); Rutger Meyer Timmerman Thijssen, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/706,319

(22) Filed: Mar. 28, 2022

(65) Prior Publication Data

US 2022/0352002 A1 Nov. 3, 2022

Related U.S. Application Data

(62) Division of application No. 16/183,896, filed on Nov. 8, 2018, now Pat. No. 11,289,361.

(Continued)

(51) Int. Cl.
*H01L 21/00* (2006.01)
*H01L 21/683* (2006.01)
(Continued)

(52) U.S. Cl.
CPC ........ *H01L 21/6838* (2013.01); *B25B 11/005* (2013.01); *H01L 21/6831* (2013.01);
(Continued)

(58) Field of Classification Search
CPC .. B25B 11/00; B25B 11/005; H01L 21/67784
See application file for complete search history.

(56) References Cited

U.S. PATENT DOCUMENTS 5,374,829 A 12/1994 Sakamoto et al.
7,019,819 B2 3/2006 Choi et al.
(Continued)

FOREIGN PATENT DOCUMENTS

CN 1221364 A 6/1999
JP H08-051143 A 2/1996
(Continued)

OTHER PUBLICATIONS

International Search Report and Written Opinion for International Application No. PCT/US2018/059557 dated Feb. 26, 2019.
(Continued)

*Primary Examiner* — Lee D Wilson
(74) *Attorney, Agent, or Firm* — Patterson + Sheridan, LLP

(57) ABSTRACT

Embodiments described herein relate to a substrate chucking apparatus having a plurality of cavities formed therein. The cavities are formed in a body of the chucking apparatus and a plurality of support elements extend from the body and separate each of the plurality of cavities. In one embodiment, a first plurality of ports are formed in a top surface of the body and extend to a bottom surface of the body through one or more of the plurality of support elements. In another embodiment, a second plurality of ports are formed in a bottom surface of the plurality of cavities and extend through the body to a bottom surface of the body. In yet another embodiment, a first electrode assembly is disposed adjacent the top surface of the body within each of the plurality of support elements and a second electrode assembly is disposed within the body adjacent each of the plurality of cavities.

20 Claims, 4 Drawing Sheets

Related U.S. Application Data

(60) Provisional application No. 62/584,285, filed on Nov. 10, 2017.

(51) Int. Cl.
    *B25B 11/00*           (2006.01)
    *H01L 21/687*         (2006.01)
    *F21V 8/00*            (2006.01)

(52) U.S. Cl.
    CPC ...... *H01L 21/6833* (2013.01); *H01L 21/6875* (2013.01); *H01L 21/68735* (2013.01); *G02B 6/0065* (2013.01)

(56) References Cited

U.S. PATENT DOCUMENTS

| | | | |
|---|---|---|---|
| 7,607,647 B2 * | 10/2009 | Zhao | H01L 21/6838 |
| | | | 269/21 |
| 7,798,801 B2 | 9/2010 | Babbs et al. | |
| 8,109,753 B2 | 2/2012 | Choi et al. | |
| 9,164,375 B2 | 10/2015 | Ganapathisubramanian et al. | |
| 2005/0035514 A1 | 2/2005 | Hillman et al. | |
| 2005/0215073 A1 * | 9/2005 | Nakamura | H01L 21/67109 |
| | | | 438/778 |
| 2010/0133735 A1 * | 6/2010 | Katsuta | B23Q 3/088 |
| | | | 269/21 |
| 2011/0155008 A1 | 6/2011 | Shizawa et al. | |
| 2016/0111318 A1 * | 4/2016 | Ichinose | G03F 7/20 |
| | | | 269/21 |
| 2016/0276198 A1 | 9/2016 | Anada et al. | |
| 2019/0148208 A1 * | 5/2019 | Godet | B25B 11/005 |
| | | | 361/234 |

FOREIGN PATENT DOCUMENTS

| | | |
|---|---|---|
| JP | H 08-250454 A | 9/1996 |
| JP | 3154629 B2 | 4/2001 |
| JP | 2001-127144 A | 5/2001 |
| JP | 2001127145 A | 5/2001 |
| JP | 2004146585 A | 5/2004 |
| JP | 2005079415 A | 3/2005 |
| JP | 2007158168 A | 6/2007 |
| JP | 2007-258443 A | 10/2007 |
| JP | 2008112763 A | 5/2008 |
| JP | 2008135736 A | 6/2008 |
| JP | 2010238909 A | 10/2010 |
| JP | 2013197465 A | 9/2013 |
| JP | 2014-209615 A | 11/2014 |
| JP | 2014-229910 A | 12/2014 |
| JP | 2016-115933 A | 6/2016 |
| KR | 20160020352 A | 2/2016 |
| KR | 10-2016-0057075 A | 5/2016 |
| KR | 10-2016-0113745 A | 9/2016 |
| TW | 360937 B | 6/1999 |
| TW | 472500 B | 1/2002 |
| TW | 201342427 A | 10/2013 |

OTHER PUBLICATIONS

Office Action for Taiwan Application No. 107139647 dated Jul. 10, 2019.

Search Report for Taiwan Application No. 107139647 dated Jul. 4, 2019.

Office Action for Taiwan Application No. 107139647 dated Mar. 10, 2020.

Extended European Search Report for European Application No. 18877264.4 dated Jun. 24, 2021.

Office Action for Japanese Application No. 2020-524808 dated Aug. 17, 2021.

Korean Patent Application No. 10-2020-7016221, Notice of Preliminary Rejection dated Nov. 11, 2021, 10 pages.

* cited by examiner

PATTERNED CHUCK FOR DOUBLE-SIDED PROCESSING

CROSS-REFERENCE TO RELATED APPLICATIONS

This application is a divisional of co-pending U.S. patent application Ser. No. 16/183,896, filed Nov. 8, 2018, which claims benefit of U.S. provisional patent application Ser. No. 62/584,285, filed Nov. 10, 2017. Each of the aforementioned related patent applications is herein incorporated by reference.

BACKGROUND

Field

Embodiments of the present disclosure generally relate to a substrate chuck. More specifically, embodiments described herein relate to a patterned substrate chuck.

Description of the Related Art

Substrate chucking apparatus are commonly used in the semiconductor and display industries to support a substrate during transfer or processing of the substrate. Emerging technologies have lead to the development of various advanced processing techniques for device and structure fabrication on substrates. For example, fabrication of waveguide apparatus for virtual reality and augmented reality applications have pushed the boundaries of conventional substrate processing techniques.

Waveguide apparatus incorporate microstructures formed on a glass or glass-like substrate. Often, microstructures are formed on a front side of the substrate and a backside of the substrate. However, handling and supporting a substrate with microstructures formed on the front and back of the substrate during processing is challenging. For example, conventional chucking apparatus may damage microstructures formed on a backside of the substrate while the front side is being processed.

Thus, what is needed in the art are improved chucking apparatus.

SUMMARY

In one embodiment, a substrate chucking apparatus is provided. The apparatus includes a body having a top surface and a bottom surface opposite the top surface, a plurality of cavities formed in the body and recessed from the top surface, and a plurality of support elements separating the plurality of cavities extending from the body to the top surface. A plurality of ports are formed in the body and extend from the top surface to the bottom surface through one or more of the plurality of support elements and a conduit is in fluid communication with each of the plurality of ports.

In another embodiment, a substrate chucking apparatus is provided. The apparatus includes a body having a top surface and a bottom surface opposite the top surface, a plurality of cavities formed in the body and recessed from the top surface, and a plurality of support elements separating the plurality of cavities extending from the body to the top surface. A first plurality of ports are formed in the body and extend from the top surface to the bottom surface through one or more of the plurality of support elements and a first conduit is in fluid communication with each of the first plurality of ports. A second plurality of ports are formed in the body and extend from a bottom surface of each of the plurality of cavities to the bottom surface of the body. A second conduit is in fluid communication with each of the second plurality of ports.

In another embodiment, a substrate chucking apparatus is provided. The apparatus includes a body having a top surface and a bottom surface opposite the top surface, a plurality of cavities formed in the body and recessed from the top surface, and a plurality of support elements separating the plurality of cavities and extending from the body to the top surface. A polymeric coating is disposed on the top surface of the body, the plurality of support elements, and within the plurality of cavities. A first electrode assembly is disposed adjacent the top surface of the body and within each of the plurality of support elements and a second electrode assembly is disposed adjacent each of the plurality of cavities.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to a substrate chucking apparatus having a plurality of cavities formed therein. The cavities are formed in a body of the chucking apparatus and a plurality of support elements extend from the body and separate each of the plurality of cavities. In one embodiment, a first plurality of ports are formed in a top surface of the body and extend to a bottom surface of the body through one or more of the plurality of support elements. In another embodiment, a second plurality of ports are formed in a bottom surface of the plurality of cavities and extend through the body to a bottom surface of the body. In yet another embodiment, a first electrode assembly is disposed adjacent the top surface of the body within each of the plurality of support elements and a second electrode assembly is disposed within the body adjacent each of the plurality of cavities.

Figure 1A:
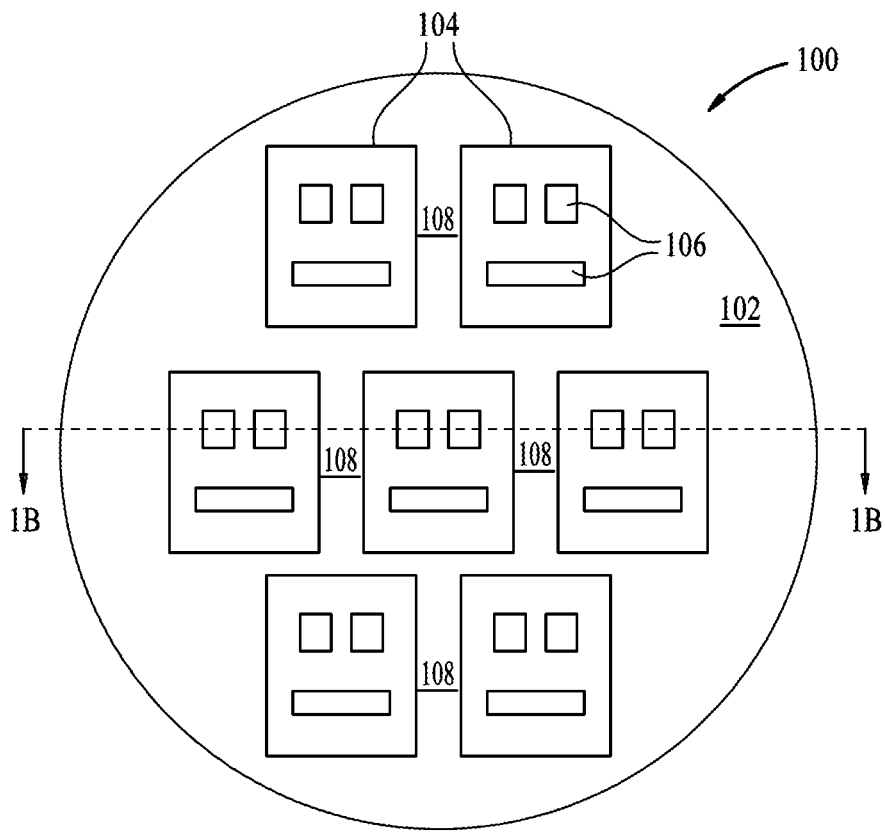
FIG. 1A illustrates a plan view of a substrate with dies having microstructures formed thereon according to an embodiment described herein.

FIG. 1A illustrates a plan view of a substrate 100 with dies having microstructures 106 formed thereon according to an embodiment described herein. In one embodiment, the substrate 100 is formed from a glass or glass-like material, such as quartz or sapphire. In another embodiment, the substrate is formed from a semiconducting material, such as a silicon material or the like. Although the substrate 100 is illustrated as having a substantially circular shape, it is contemplated that the substrate 100 may be polygonal in shape, such as quadrilateral in shape, for example, rectangular or square shaped.

The substrate 100 is illustrated as having a plurality of dies 104 formed thereon. The dies 104 correspond to areas of the substrate 100 which are patterned with desired structures for subsequent utilization in various devices, such as a computing device, an optical device, or the like. The dies 104 include the microstructures 106 formed thereon. The microstructures 106 are features formed on the dies 104 by various fabrication processes, such as lithography processes, for example, nanoimprint lithography (NIL) processes. Alternatively, the microstructures 106 are features which are etched or deposited on the substrate 100. In one embodiment, the microstructures 106 are grating structures and the die 104 is contemplated to be a waveguide or a portion of a waveguide apparatus.

The dies 104 are arranged on the substrate 100 with kerf areas 108 formed between adjacent dies 104. The kerf areas 108 are regions of the substrate surface which are not occupied by the dies 104. The kerf areas 108 substantially surround each individual die 104 and space individual dies 104 from one another. The kerf areas 108 may also extend between individual dies 104 and a perimeter of the substrate 100. In one embodiment, the kerf areas 108 have substantially no microstructures or features formed thereon. In various implementations, the kerf areas 108 are regions which are subsequently removed during dicing operations to separate individual dies 104 during singulation.

Figure 1B:
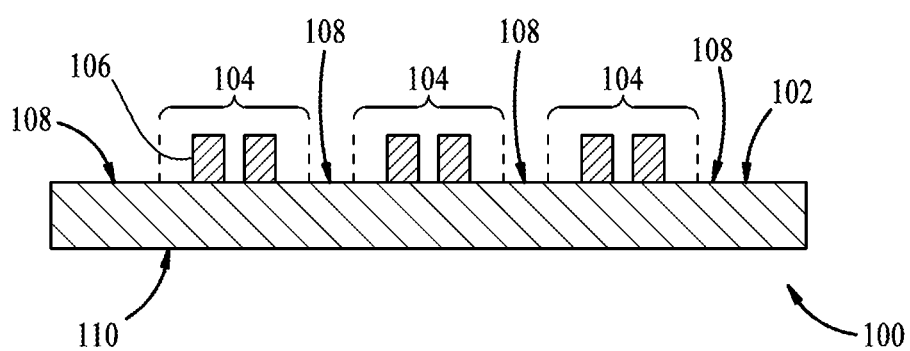
FIG. 1B illustrates a cross-sectional view of the substrate of FIG. 1A taken along line 1B-1B according to an embodiment described herein.

FIG. 1B illustrates a cross-sectional view of the substrate 100 of FIG. 1A taken along line 1B-1B according to an embodiment described herein. As described above, the kerf areas 108 are regions which are disposed between adjacent dies 104. It should be noted that the substrate 100 is illustrated as having the microstructures 106 formed on a first side 102 of the substrate 100. In one embodiment, the microstructures 106 extend a distance of between about 100 um and about 500 um from the first side 102 of the substrate 100. In one embodiment, the first side 102 is the front side of the substrate 100. A second side 110 of the substrate 100 exists opposite and parallel to the first side 102. In the illustrated embodiment, the second side 110 is unprocessed such that no features or microstructures are formed on the second side 110.

Figure 2:
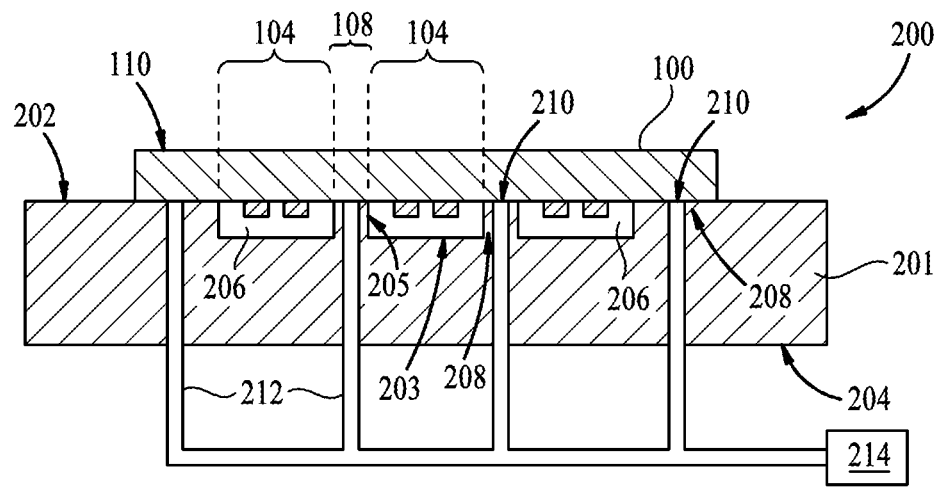
FIG. 2 illustrates a cross-section view of a vacuum chucking apparatus according to an embodiment described herein.

FIG. 2 illustrates a cross-section view of a vacuum chucking apparatus 200 according to an embodiment described herein. The substrate 100 is illustrated as having the first side 202 contacting the apparatus 200 such that the second side 110 is oriented away from the apparatus 200 in a position suitable for processing the second side 110.

The chucking apparatus 200 includes a body 201 having a top surface 202 and a bottom surface 204 oriented opposite the top surface 202. In one embodiment, the body 201 is formed from a metallic material, such as aluminum, stainless steel, or alloys, combinations, and mixtures thereof. In another embodiment, the body 201 is formed from a ceramic material, such as a silicon nitride material, an aluminum nitride material, an alumina material, or combinations and mixtures thereof. In certain embodiments, a coating is disposed on the top surface 202 of the body 201. The coating, depending upon the desired implementation, is a polymeric material, such as one or more of a polyimide material, a polyamide material, or a polytetrafluoroethylene (PTFE) material.

A plurality of cavities 206 are formed in the body 201. The cavities 206 are disposed within the body 201 and extend into the body 201 from the top surface 202. The cavities 206 are defined by a bottom surface 203 and sidewalls 205. A depth of the cavities 206 is between about 100 um and about 1000 um, for example between about 300 um and about 700 um. It is contemplated that the depth of the cavities 206 is sufficient to accommodate the microstructures 106 formed on the substrate 100 such that the microstructures 106 remain out of contact with the body 201 when the substrate 100 is positioned on the chucking apparatus 200. In one embodiment, the plurality of cavities 206 are formed in a material layer disposed on the body 201.

In one embodiment, a shape of the cavities 206 corresponds to a shape of the dies 104. For example, if the dies 104 are square or rectangular shaped, the shape of the cavities 206 would similarly be square or rectangular in shape. However, it is contemplated that the size of the cavities 206 may be larger or smaller than an area corresponding to the dies 104.

The cavities 206 are separated by a plurality of support elements 208 which are part of and extend from the body 201 to the top surface 202 of the body 201. In addition to separating adjacent cavities 206, the support elements 208 extend about and surround each of the cavities 206. The support elements 208 further define the sidewalls 205 of the cavities 206. In operation, the substrate 100 is positioned on the apparatus 200 such that the kerf areas 108 are aligned with and contact the support elements 208. In this manner, the dies 104 are aligned with the cavities 206 such that the microstructures 106 remain out of contact with the body 201 of the apparatus 200.

A first plurality of ports 210 are formed in the top surface 202 of the body 201. In one embodiment, the first plurality of ports 210 are positioned on the top surface 202 of the support elements 208. The first plurality of ports 210 are aligned with the support elements 208 between the cavities 206. The first plurality of ports 210 are also formed in the top surface 202 of the body radially outward of the plurality of cavities 206. A first plurality of conduits 212 extend from the first plurality of ports 210 at the top surface 202 through the body 201 to the bottom surface 204. The first plurality of conduits 212 are coupled to a first vacuum source 214. Thus, the first vacuum source 214 is in fluid communication with the top surface 202 of the body 201 via the first plurality of conduits 212 and the first plurality of ports 210.

In operation, vacuum pressure is generated to chuck the substrate 100 to the body 201 at regions remote from the cavities 206. It is contemplated that vacuum chucking the substrate 100 to the body 201 is sufficient to achieve desirable substrate flatness for subsequent processing of the unprocessed second side 110 of the substrate.

Figure 3A:
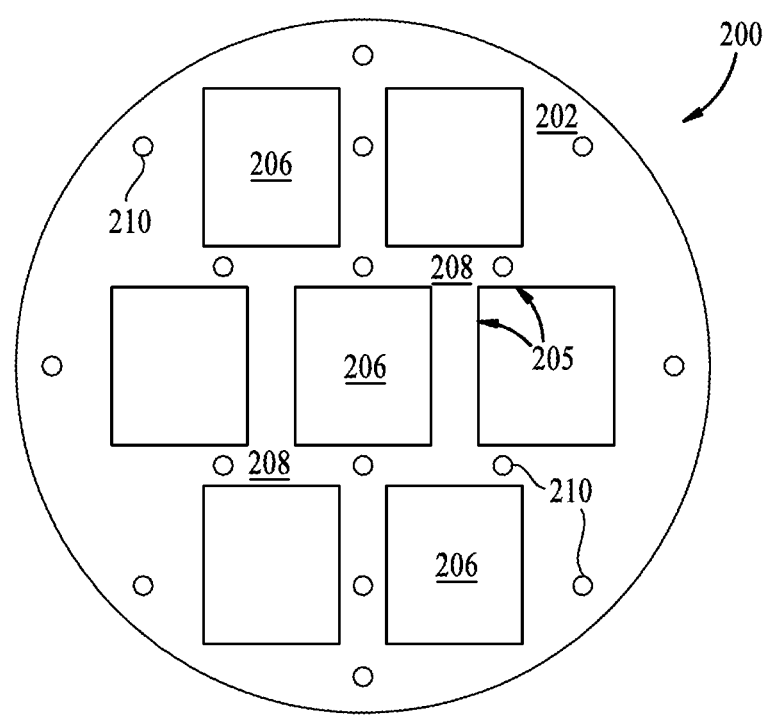
FIG. 3A illustrates a plan view of the vacuum chucking apparatus of FIG. 2 according to an embodiment described herein.

FIG. 3A illustrates a plan view of the vacuum chucking apparatus 200 of FIG. 2 according to an embodiment described herein. The first plurality of ports 210 are disposed over regions corresponding to the support elements 208. In the illustrated embodiment, the first plurality of ports 210 at the top surface 202 are substantially circular in shape. While circular ports may improve the ease of fabrication of the apparatus 200, it is contemplated that any port shape may be utilized as described with regard to FIG. 3B. Although several ports 210 are shown distributed across the top surface 202 of the body 201, any number, arrangement, or distribution of ports 210 suitable to enable substantially flat chucking of the substrate 100 are contemplated to be within the scope of this disclosure.

Figure 3B:
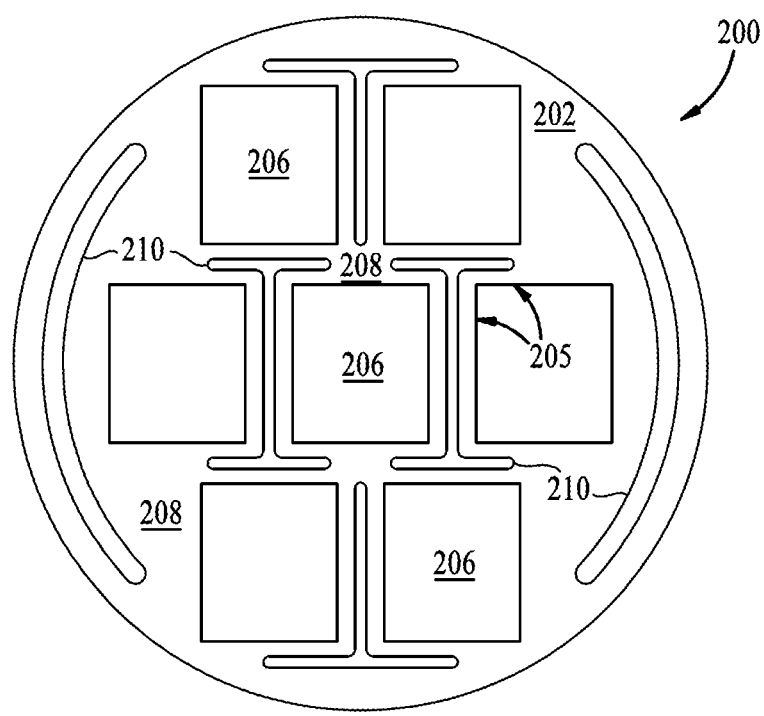
FIG. 3B illustrates a plan view of the vacuum chucking apparatus of FIG. 2 according to an embodiment described herein.

FIG. 3B illustrates a plan view of the vacuum chucking apparatus 200 of FIG. 2 according to an embodiment described herein. The illustrated ports 210 are irregularly shaped to increase the surface area of the substrate exposed to vacuum relative to the embodiment shown in FIG. 3A. Any desirable shape may be utilized so long as the ports 210 are aligned with the support elements 208.

Figure 4:
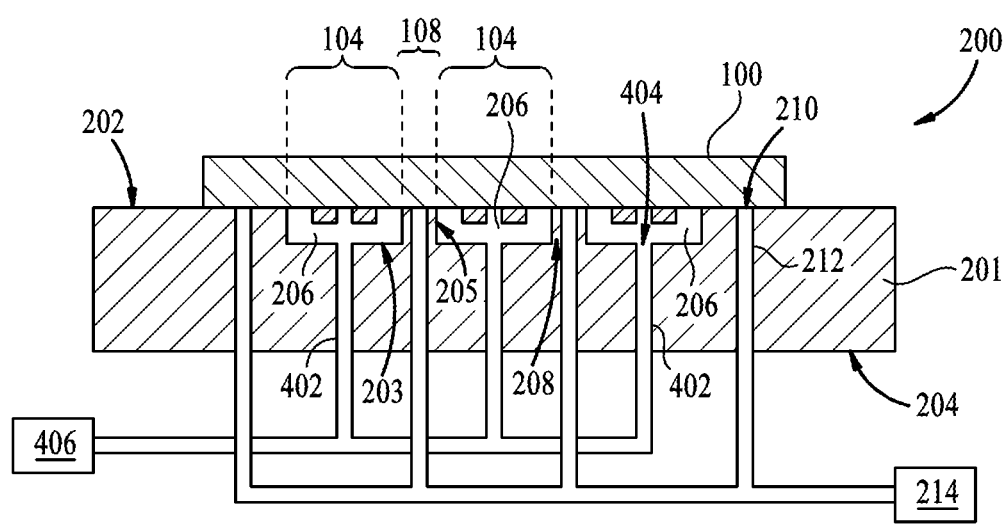
FIG. 4 illustrates a cross-sectional view of a vacuum chucking apparatus according to an embodiment described herein.

FIG. 4 illustrates a cross-sectional view of the vacuum chucking apparatus 200 according to an embodiment described herein. In the illustrated embodiment, the apparatus 200 includes a second plurality of ports 404, a second plurality of conduits 402, and a second vacuum source 406. The second plurality of ports 404 are formed in the bottom surface 203 of the cavities 206 and the second plurality of conduits 402 extend from each of the second plurality of ports 404 through the body 201 to the bottom surface 204. The second plurality of conduits 402 are coupled to the second vacuum source 406 accordingly.

In operation, the apparatus 200 of FIG. 4 enables differential pressure chucking of the substrate 100. The first vacuum source 214, which is in fluid communication with the substrate 100 via the first plurality of conduits 212 and the first plurality of ports 210, generates a first vacuum pressure to chuck the substrate to the top surface 202 of the body 201. The second vacuum source 406, which is in fluid communication with the cavities 206 via the second plurality of conduits 402 and the second plurality of ports 404, generates a second vacuum pressure to further reduce a pressure with the cavities 206 and reduce or eliminate warpage of the substrate 100 during exposure to the first vacuum pressure. It is contemplated that the first vacuum pressure may be greater than, less than, or equal to the second vacuum pressure, depending upon desired chucking characteristics.

Figure 5:
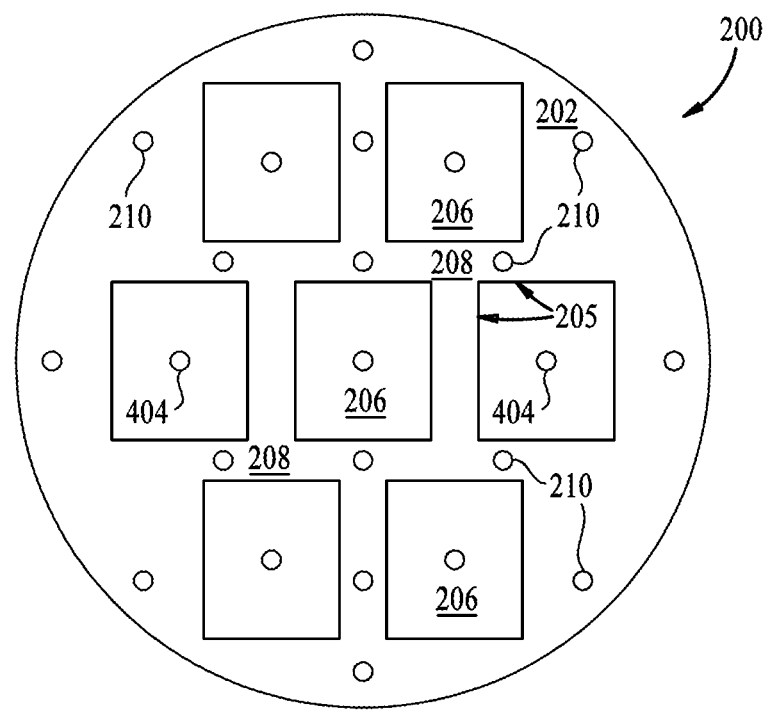
FIG. 5 illustrates a plan view of the vacuum chucking apparatus of FIG. 4 according to an embodiment described herein.

FIG. 5 illustrates a plan view of the vacuum chucking apparatus 200 of FIG. 4 according to an embodiment described herein. As illustrated, the second plurality of ports 404 are positioned within the cavities 206. It is contemplated that one or both of the first and second plurality of ports 210, 404, may be used in concert with one another or independently to achieve chucking of the substrate 100 to the body 201. While the second plurality of ports 404 are illustrated as being circular in shape, it is contemplated that various polygonal shapes may be alternately utilized, similar to the first plurality of port shapes illustrated in FIG. 3B. For example, the second plurality of ports 404 may be annular in shape or a multitude of second ports 404 may be disposed within a single cavity 206.

Figure 6:
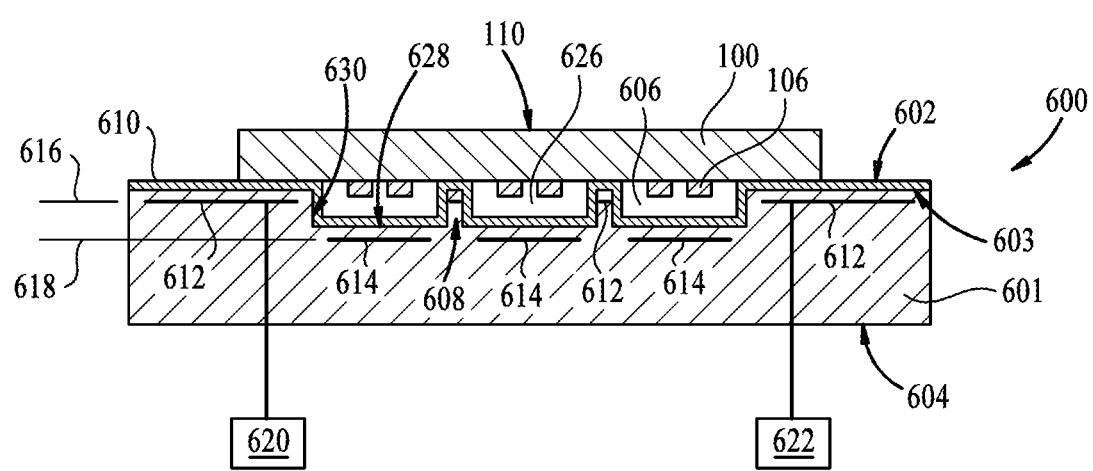
FIG. 6 illustrates a cross-sectional view of an electrostatic chucking apparatus according to an embodiment described herein.

FIG. 6 illustrates a cross-sectional view of an electrostatic chucking apparatus 600 according to an embodiment described herein. Similar to the apparatus 200, the apparatus 600 includes a body 601 having a top surface 603 and a bottom surface 604 oriented opposite the top surface 603. In one embodiment, the body 601 is formed from a metallic material, such as aluminum, stainless steel, or alloys, combinations, and mixtures thereof. In another embodiment, the body 601 is formed from a ceramic material, such as a silicon nitride material, an aluminum nitride material, an alumina material, or combinations and mixtures thereof. In certain embodiments, a coating 602 is disposed on the top surface 603 of the body 601. The coating 602, depending upon the desired implementation, is a polymeric material, such as one or more of a polyimide material, a polyamide material, or a polytetrafluoroethylene (PTFE) material.

A plurality of cavities 626 are formed in the body 601. The cavities 626 are disposed within the body 601 and extend into the body 601 from the top surface 603. The cavities 626 are defined by a bottom surface 628 and sidewalls 630. A depth of the cavities 626 is between about 0.5 um and about 1000 um, for example between about 300 um and about 700 um. It is contemplated that the depth of the cavities 626 is sufficient to accommodate the microstructures 106 formed on the substrate 100 such that the microstructures 106 remain out of contact with the body 601 when the substrate 100 is positioned on the chucking apparatus 600.

The coating 602 extends along the top surface 603 of the body 601 and over the sidewalls 630 and bottom surface 628 of the cavities 626. Similarly, the coating 602 extends over support members 608 which define the sidewalls 630 of the cavities 626. A thickness of the coating 602 is contemplated to be sufficient to enable electrostatic chucking of the substrate 100 to the body 601. As such, the coating 602 is believed to influence an electrostatic force applied to the substrate 100 via electrode assemblies 612, 614.

A first electrode assembly 612 is disposed within the body 601 adjacent the top surface 603 of the body 601. The first electrode assembly 612 includes one or more leads coupled to a first power source 620. In one embodiment, the first electrode assembly 612 is a single lead. Alternatively, the first electrode assembly 612 includes multiple leads. In this embodiment, the leads of the first electrode assembly 612 may be disposed in an interleaving arrangement. The first power source 620 is configured to deliver power of a desired polarity to the first electrode assembly 612. In one embodiment, the first power source 620 delivers a current with positive polarity to the first electrode assembly 612. In another embodiment, the first power source 620 delivers a current with negative polarity to the first electrode assembly 612.

A second electrode assembly 614 is disposed within the body 601 adjacent the bottom surface 628 of the cavities 626. Similar to the first electrode assembly 612, the second electrode assembly 614 includes one or more leads. In one embodiment, the second electrode assembly 614 is a single lead. In another embodiment, the second electrode assembly 614 includes multiple leads. In this embodiment, the leads of the second electrode assembly 614 may be disposed in an interleaving arrangement. The second electrode assembly 614 is coupled to a second power source 622 which is configured to deliver power of a desired polarity to the second electrode assembly 614. In one embodiment, the second power source 622 delivers a current with a positive polarity to the second electrode assembly 614. In another embodiment, the second power source 622 delivers a current with negative polarity to the second electrode assembly 614.

In one embodiment, the first power source 620 and second power source 622 deliver current having the same polarity to the first and second electrode assemblies 612, 614, respectively. Alternatively, the first power source 620 and the second power source 622 deliver current having different polarities to the first and second electrode assemblies 612, 614, respectively.

The first electrode assembly 612 is disposed in the body 601 at a first plane 616. The second electrode assembly 614 is disposed in the body 601 at a second plane 618. In one embodiment, the first plane 616 is disposed closer to the top surface 603 than the second plane 618. In another embodiment, both of the first electrode assembly 612 and the second electrode assembly 614 are disposed in the second plane 618. By positioning the electrode assemblies 612, 614 within the body 601 according to the embodiments described above, differential electrostatic chucking of the substrate 100 may be achieved in regions of the support elements 608 and the cavities 626. Accordingly, substrate flatness may be tuned across the substrate 100 during electrostatic chucking.

While the apparatus 200, 600 described above relate to vacuum and electrostatic chucking, respectively, it is contemplated that other substrate positioning apparatus, such as clamp rings, edge rings, shadow rings, and the like may also find advantageous implementation in accordance with the embodiments described herein. The substrate positioning apparatus may be used alone or in combination with the vacuum and electrostatic chucking capabilities of the apparatus 200, 600.

In summation, a substrate chucking apparatus having cavities formed therein enables chucking of substrates with surfaces having microstructures formed thereon for dual sided substrate processing. The chucking apparatus include various vacuum or electrostatic chucking elements as described above and a chucking body topography selected to support kerf areas of a substrate during processing.

While the foregoing is directed to embodiments of the present disclosure, other and further embodiments of the disclosure may be devised without departing from the basic scope thereof, and the scope thereof is determined by the claims that follow.

What is claimed is:

1. A substrate chucking apparatus, comprising:
a body having a top surface and a bottom surface opposite the top surface, the body comprising:
a plurality of cavities formed in the body and recessed from the top surface;
one or more support elements separating the plurality of cavities extending from the body to the top surface;
a first electrode assembly disposed adjacent the top surface of the body; and
a second electrode assembly disposed adjacent to each of the plurality of cavities.

2. The apparatus of claim 1, wherein the body comprises a metallic material.

3. The apparatus of claim 1, wherein the first electrode assembly comprises one or more first leads coupled to a first power source, and the second electrode assembly comprises one or more second leads coupled to a second power source.

4. The apparatus of claim 1, wherein the body is a ceramic material.

5. The apparatus of claim 3, wherein the first and second power sources deliver current having the same polarity to the first and second electrode assemblies, respectively.

6. The apparatus of claim 3, wherein the first and second power sources deliver current having different polarities to the first and second electrode assemblies, respectively.

7. The apparatus of claim 1, further comprising a polymeric material disposed on the body wherein the polymeric material is selected from the group consisting of a polyimide material, a polyamide material, and a polytetrafluoroethylene material.

8. The apparatus of claim 1, wherein the first and second electrode assemblies are disposed along a plane parallel with the top surface of the body such that the first and second electrode assemblies are equidistant from a plane of the top surface.

9. The apparatus of claim 1, wherein the first electrode assembly is disposed closer to a plane of the top surface of the body than the second electrode.

10. The apparatus of claim 2, wherein the metallic material comprises an aluminum material, a stainless steel material, or alloys, combinations, and mixtures thereof.

11. The apparatus of claim 1, wherein the second electrode assembly is disposed below a base of each of the plurality of cavities.

12. The apparatus of claim 4, wherein the ceramic material is a silicon nitride material, an aluminum nitride material, an alumina material, or combinations and mixtures thereof.

13. The apparatus of claim 10, further comprising a polymeric material disposed on the body wherein the polymeric material is selected from the group consisting of a polyimide material, a polyamide material, and a polytetrafluoroethylene material.

14. The apparatus of claim 12, further comprising a polymeric material disposed on the body wherein the polymeric material is selected from the group consisting of a polyimide material, a polyamide material, and a polytetrafluoroethylene material.

15. A substrate chucking apparatus, comprising:
a body having a top surface and a bottom surface opposite the top surface, the body having a plurality of cavities formed therein and recessed from the top surface, the body having a plurality of support elements separating the plurality of cavities extending from the body to the top surface, the body having a first electrode assembly disposed adjacent the top surface of the body and within each of the plurality of support elements, and the body having a second electrode assembly disposed adjacent each of the plurality of cavities; and
a polymeric coating disposed on the top surface of the body, the plurality of support elements, and within the plurality of cavities.

16. The apparatus of claim 15, wherein the first electrode assembly comprises one or more leads coupled to a first power source, and the second electrode assembly comprises one or more leads coupled to a second power source.

17. The apparatus of claim 15, wherein the polymeric coating comprises material selected from the group consisting of a polyimide material, a polyamide material, and a polytetrafluoroethylene material.

18. The apparatus of claim 15, wherein the first and second electrode assemblies are disposed along a plane parallel with the top surface of the body such that the first and second electrode assemblies are equidistant from a plane of the top surface.

19. The apparatus of claim 15, wherein the first electrode assembly is disposed closer to a plane of the top surface of the body than the second electrode.

20. The apparatus of claim 15, wherein the first electrode assembly comprises a plurality of first leads disposed in an interleaving arrangement and coupled to a first power source, and the second electrode assembly comprises a plurality of second leads disposed in an interleaving arrangement and coupled to a second power source.

* * * * *